United States Patent
Chen et al.

(10) Patent No.: US 8,737,936 B2
(45) Date of Patent: May 27, 2014

(54) AMPLITUDE MODULATION CIRCUIT IN POLAR TRANSMITTER AND METHOD FOR CALIBRATING AMPLITUDE OFFSET IN POLAR TRANSMITTER

(75) Inventors: Hsin-Hung Chen, Miaoli County (TW); Hsiang-Hui Chang, New Taipei (TW); Chun-Pang Wu, Kaohsiung (TW); Yung-Yu Lin, Taipei (TW); Jong-Woei Chen, Taichung (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 320 days.

(21) Appl. No.: 13/279,319

(22) Filed: Oct. 23, 2011

(65) Prior Publication Data

US 2012/0040630 A1 Feb. 16, 2012

Related U.S. Application Data

(63) Continuation of application No. 12/335,540, filed on Dec. 16, 2008, now Pat. No. 8,073,406.

(51) Int. Cl.
*H03L 7/06* (2006.01)

(52) U.S. Cl.
USPC .......................................... 455/108; 455/102

(58) Field of Classification Search
USPC ........................... 455/102, 108, 127.1, 127.2
See application file for complete search history.

(56) References Cited

U.S. PATENT DOCUMENTS

| | | | |
|---|---|---|---|
| 6,750,719 B2 * | 6/2004 | Toyota et al. | 330/285 |
| 6,834,183 B2 | 12/2004 | Black | |
| 7,394,862 B2 | 7/2008 | Jensen | |
| 7,469,130 B2 | 12/2008 | Mayer | |
| 7,570,707 B2 | 8/2009 | Jensen | |
| 7,961,812 B2 | 6/2011 | Jensen | |
| 7,983,632 B2 * | 7/2011 | Zolfaghari | 455/102 |
| 7,991,366 B2 * | 8/2011 | Lee | 455/108 |
| 8,180,302 B2 * | 5/2012 | Lewis | 455/73 |
| 8,457,567 B2 * | 6/2013 | Ryter | 455/108 |
| 2006/0045205 A1 | 3/2006 | Jensen | |
| 2006/0089111 A1 | 4/2006 | Mayer et al. | |
| 2007/0264946 A1 | 11/2007 | Rozenblit | |

FOREIGN PATENT DOCUMENTS

| | | |
|---|---|---|
| CN | 101257466 A | 9/2008 |
| TW | I242943 | 11/2005 |

* cited by examiner

*Primary Examiner* — Brian Young
(74) *Attorney, Agent, or Firm* — Winston Hsu; Scott Margo

(57) ABSTRACT

An amplitude modulation circuit in a polar transmitter includes a digital-to-analog converter (DAC), a filter, a gm stage, and a calibration module. The DAC is arranged to be coupled to an amplitude modulation signal input in a normal mode. The filter is coupled to the DAC, and the gm stage is coupled to the filter. The calibration module has an input coupled to the gm stage, and an output coupled to a node on a path between the DAC and the gm stage. A method for calibrating an amplitude offset in the polar transmitter includes: generating an amplitude offset calibration signal according to an amplitude modulation signal generated from the gm stage; and transmitting the amplitude offset calibration signal via the output of the calibration module to a node on a path between the DAC and the gm stage so as to calibrate the amplitude offset.

21 Claims, 9 Drawing Sheets

US 8,737,936 B2

AMPLITUDE MODULATION CIRCUIT IN POLAR TRANSMITTER AND METHOD FOR CALIBRATING AMPLITUDE OFFSET IN POLAR TRANSMITTER

CROSS REFERENCE TO RELATED APPLICATIONS

This is a continuation of co-pending U.S. patent application Ser. No. 12/335,540, filed on Dec. 16, 2008 and incorporated herein by reference.

BACKGROUND

The present invention relates to a polar transmitter, and more particularly, to an amplitude modulation circuit in a polar transmitter and a method for calibrating the amplitude offset in the polar transmitter.

Conventional polar transmitters have already been disclosed and discussed in various literatures such as U.S. Patent Publication No. 20060089111, whose content is incorporated herein by reference. Furthermore, in transmission systems in which a combined AM and PM signal is used in a power control loop having a wide range of power output levels and to meet strict GSM/enhanced data rates for GSM evolution (EDGE) spectral emissions limitations, a high level of precision is typically required when converting the amplitude modulated portion of the transmit signal from the digital domain to the analog domain. This typically requires a DAC having 11-bit resolution, and when a larger cover range for the DC offset is required in U.S. Patent Publication No. 20060089111, it has to use a DAC having higher resolution such as 12-bit or 13-bit. However, such a DAC is costly to implement, both with respect to area on the circuit and power consumption. For example, the 12-bit DAC has twice larger area than the 11-bit DAC.

SUMMARY OF THE INVENTION

It is therefore one of the objectives of the present invention to provide an amplitude modulation circuit in a polar transmitter and a method for calibrating the amplitude offset in the polar transmitter with digital-to-analog converters (DAC) having smaller area, so as to solve the above problem.

In accordance with an embodiment of the present invention, an amplitude modulation circuit in a polar transmitter is disclosed. The amplitude modulation circuit includes a digital-to-analog converter (DAC), a filter, a gm stage, and a calibration module. The DAC is arranged to be coupled to an amplitude modulation signal input in a normal mode. The filter is coupled to the DAC, and the gm stage is coupled to the filter. The calibration module has an input coupled to the gm stage, and an output coupled to a node on a path between the DAC and the gm stage.

In accordance with an embodiment of the present invention, a method for calibrating an amplitude offset in a polar transmitter is further disclosed. The method includes: providing an amplitude modulation circuit in the polar transmitter, the amplitude modulation circuit comprising a digital-to-analog converter (DAC), a filter coupled to the DAC, a gm stage coupled to the filter, and a calibration module having an output and an input coupled to the gm stage; generating an amplitude offset calibration signal according to an amplitude modulation signal gathered from the gm stage; and transmitting the amplitude offset calibration signal via the output of the calibration module to a node on a path between the DAC and the gm stage so as to calibrate the amplitude offset.

The main spirit of the above embodiments of the present invention polar transmitter is using an auxiliary DAC having a lower resolution (such as 6-bit) than that of a main DAC (such as 11-bit) on the amplitude modulation path, so as to achieve the same performance of the conventional polar transmitter using only one DAC having higher resolution (such as 12-bit or 13-bit), which is costly to implement, both with respect to area on the circuit and power consumption. For example, when resolution of a DAC becomes higher for one bit, the area of the DAC is doubled, and thus the 12-bit DAC has twice larger area than the 11-bit DAC. Thus, when a larger cover range for the DC offset is required, the present invention polar transmitter does not have to use a DAC having higher resolution (such as 12-bit or 13-bit) for the DAC 120. Instead, the present invention polar transmitter can use a main DAC having the original resolution (such as 11-bit) with an auxiliary DAC having a lower resolution (such as 6-bit) to be economical to implement, both with respect to area on the circuit and power consumption.

In accordance with an embodiment of the present invention, an amplitude modulation circuit in a polar transmitter is yet further disclosed. The amplitude modulation circuit includes a digital-to-analog converter (DAC), a filter, a gm stage, and a calibration module. The DAC is arranged to be coupled to an amplitude modulation signal input in a normal mode. The filter is coupled to the DAC, and the gm stage is coupled to the filter. The calibration module has an input coupled to the gm stage, and an output coupled to the DAC, and the calibration module is utilized for adjusting a reference voltage level of the DAC according to an amplitude modulation signal generated from the gm stage to move an offset cover range of the DAC so as to calibrate an offset of the amplitude modulation circuit.

In accordance with an embodiment of the present invention, a method for calibrating an amplitude offset in a polar transmitter is yet further disclosed. The method includes: providing an amplitude modulation circuit in the polar transmitter, the amplitude modulation circuit comprising a digital-to-analog converter (DAC), a filter coupled to the DAC, a gm stage coupled to the filter, and a calibration module having an input coupled to the gm stage and an output; generating an amplitude offset calibration signal according to an amplitude modulation signal generated from the gm stage; and feedbacking the amplitude offset calibration signal via the output of the calibration module to the DAC to adjust a reference voltage level of the DAC to move an offset cover range of the DAC so as to calibrate the amplitude offset.

Briefly summarized, the amplitude modulation circuit and the method for calibrating the DC offset in a polar transmitter disclosed by the present invention are obviously capable of calibrating the DC offset in the polar transmitter with DAC having smaller area. Thus, the present invention is economical to implement, both with respect to area on the circuit and power consumption.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

The present invention relates to an amplitude modulation circuit of a polar transmitter and a method for calibrating an amplitude offset in the polar transmitter that are capable of calibrating a DC offset of the polar transmitter with digital-to-analog converters (DAC) having smaller area.

In general, the amplitude modulation circuit and the method for calibrating the amplitude offset in the polar transmitter of the present invention can be applied to all kinds of polar transmitters such as the small polar transmitter, the large polar transmitter, and the polar loop transmitter. In addition, a person of average skill in the pertinent art should be able to understand that the present invention can be implemented with all kinds of phase modulation circuits in the polar transmitter, for example, the offset PLL modulation circuit, the direct-frequency modulation (DFM) circuit, and the two-point modulation (TPM) circuit.

Figure 1:
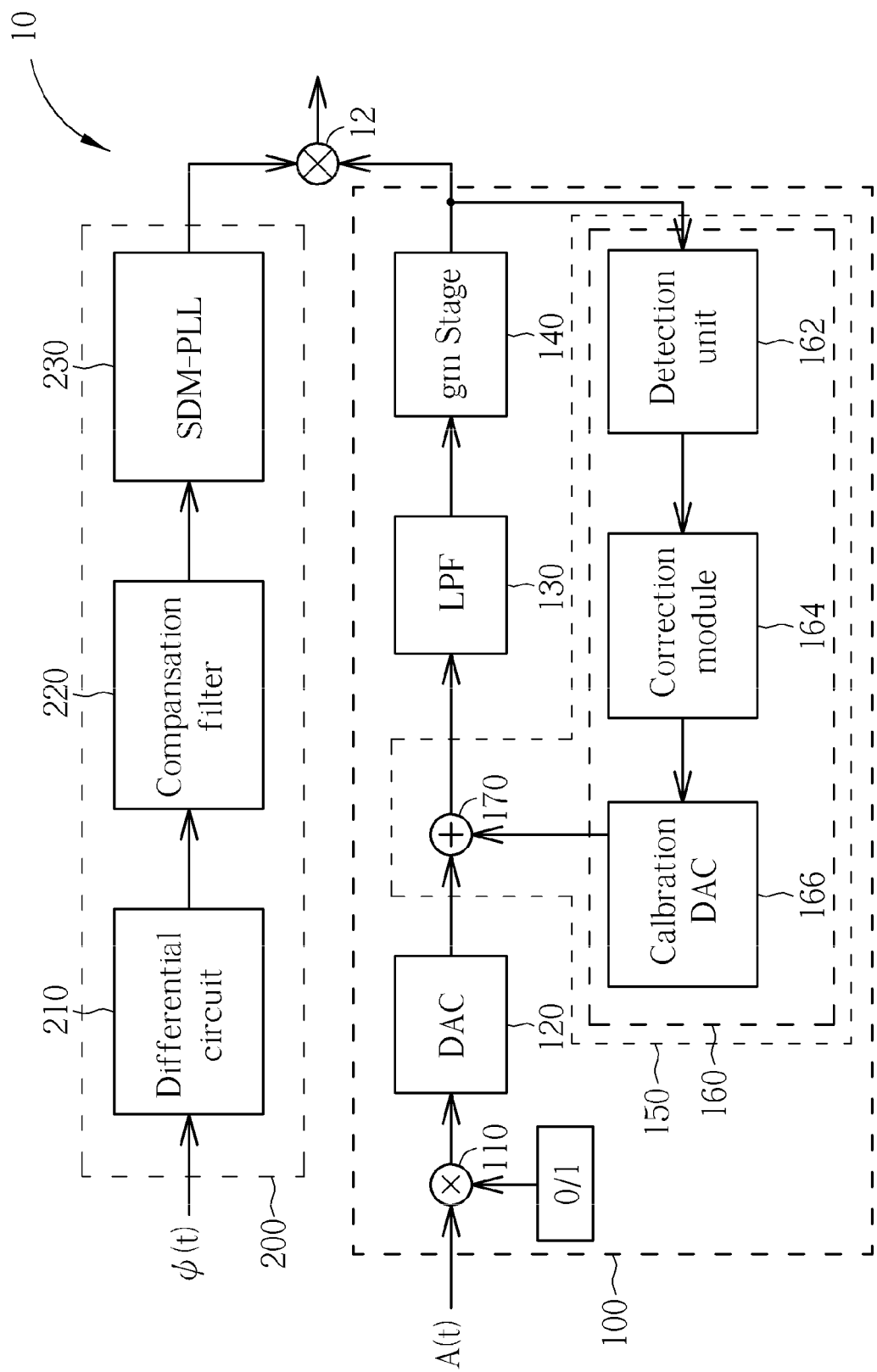
FIG. 1 shows a simplified block diagram of an amplitude modulation circuit in a polar transmitter in accordance with a first embodiment of the present invention.

Please refer to FIG. 1. FIG. 1 shows a simplified block diagram of an amplitude modulation circuit 100 in a polar transmitter 10 in accordance with a first embodiment of the present invention. As shown in FIG. 1, the polar transmitter 10 comprises the amplitude modulation circuit 100, a phase modulation circuit 200, and a mixer 12. The amplitude modulation circuit 100 comprises a multiplier 110, a DAC 120, a low pass filter (LPF) 130, a gm stage 140, and a calibration module 150. The baseband data A(t) is set to zero via multiplier 110 for DC offset calibration. The calibration module 150 comprises a calibration unit 160 and an adding unit 170. The calibration unit 160 is utilized for generating a DC offset calibration signal according to an amplitude modulation signal generated from the gm stage 140. The adding unit 170 is coupled between the DAC 120 and the LPF 130, and utilized for receiving the offset calibration signal generated from the calibration unit 160 and adding the DC offset calibration signal to the path between the DAC 120 and the LPF 130. In addition, the calibration unit 160 comprises a detection unit 162, a correction module 164, and a calibration DAC 166. The detection unit 162 is coupled to an output of the gm stage 140, and utilized for generating a DC offset detection signal according to the amplitude modulation signal. The correction module 164 is coupled to the detection unit 162, and utilized for generating a DC offset calibration value according to the DC offset detection signal. The calibration DAC 166 is coupled to the adding unit 170 and the correction module 164, and utilized for converting the DC offset calibration value into the DC offset calibration signal.

The phase modulation circuit 200 comprises a differential circuit 210, a compensation filter 220, and a sigma delta modulator phase lock loop (SDM-PLL) 230. The differential circuit 210 is coupled to an phase modulation signal φ(t). Please note that the above embodiment is only for illustration purposes and is not meant to be limitations of the present invention.

Figure 2:
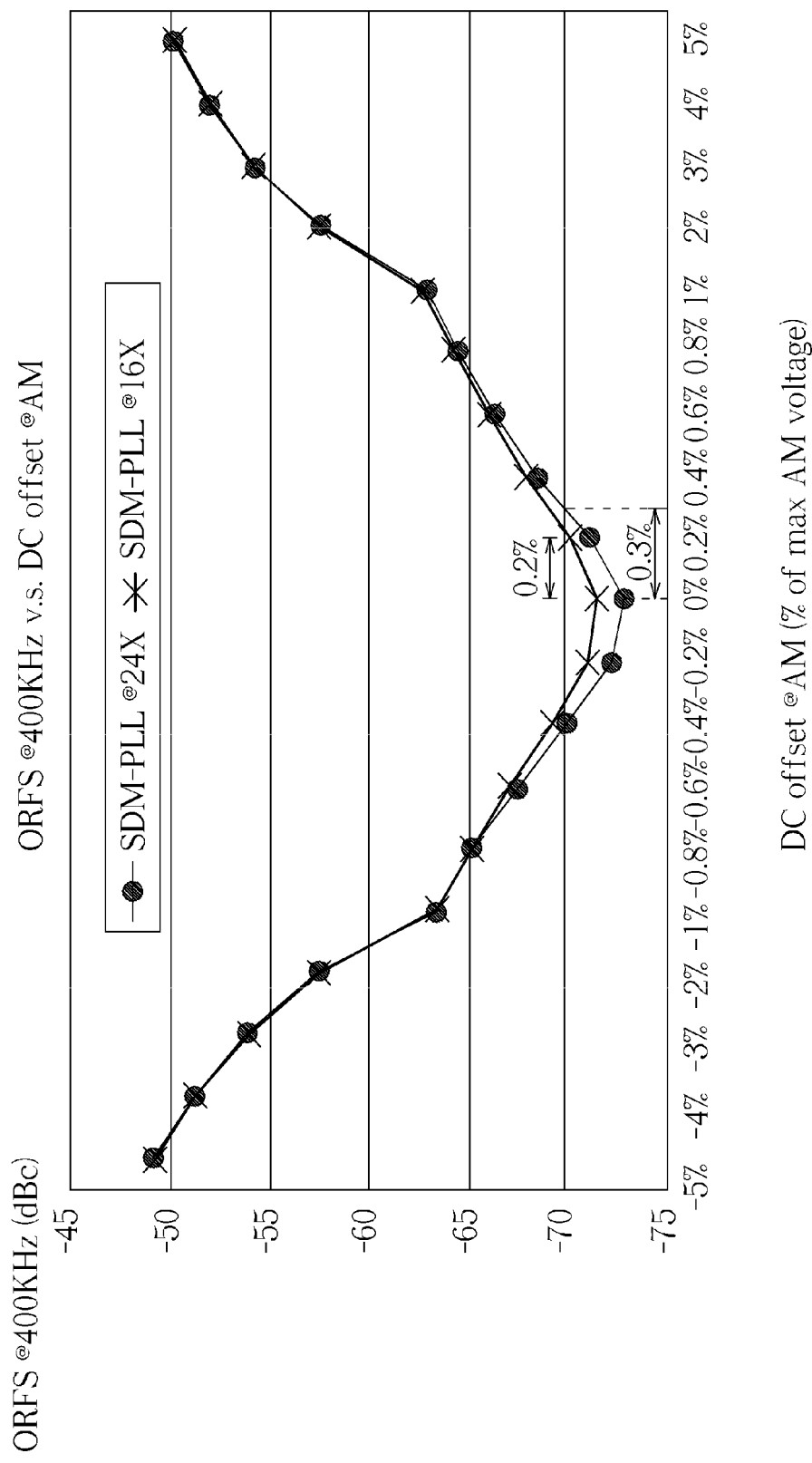
FIG. 2 shows a simplified diagram of the Output RF Spectrum (ORFS) at 400 kHz of the sigma delta modulator phase lock loop (SDM-PLL) versus DC offset for the amplitude modulation circuit 100 when the baseband circuit operates at 16× and 24×.

FIG. 2 shows a simplified diagram of the ORFS at 400 kHz of the SDM-PLL 230 versus DC offset for the amplitude modulation circuit 100 when the baseband operates at 16× and 24×. More specifically, 0.2% is a result of a DC offset voltage divided by the peak voltage on the amplitude modulation path, and 0.3% is another result of another DC offset voltage divided by the peak voltage on the amplitude path. Thus, when the baseband operates at 24× for example, the DC offset has to be controlled to be under 0.3% of the peak voltage, and the LSB of the calibration DAC 166 can be set to be 0.2% of the peak voltage for example. If the peak voltage on the amplitude modulation path is 1.5 v, then an adjusting unit of the calibration DAC 166 equals to 3 mv (i.e. 1.5 v*0.2%), and the DC offset has to be controlled to be under 4.5 mv (i.e. 1.5 v*0.3%). Thus, when the cover range of the calibration DAC 166 is required to be from +93 mV to −93 mV, the present invention can utilize a DAC having 6-bit resolution as the calibration DAC 166.

Figure 3:
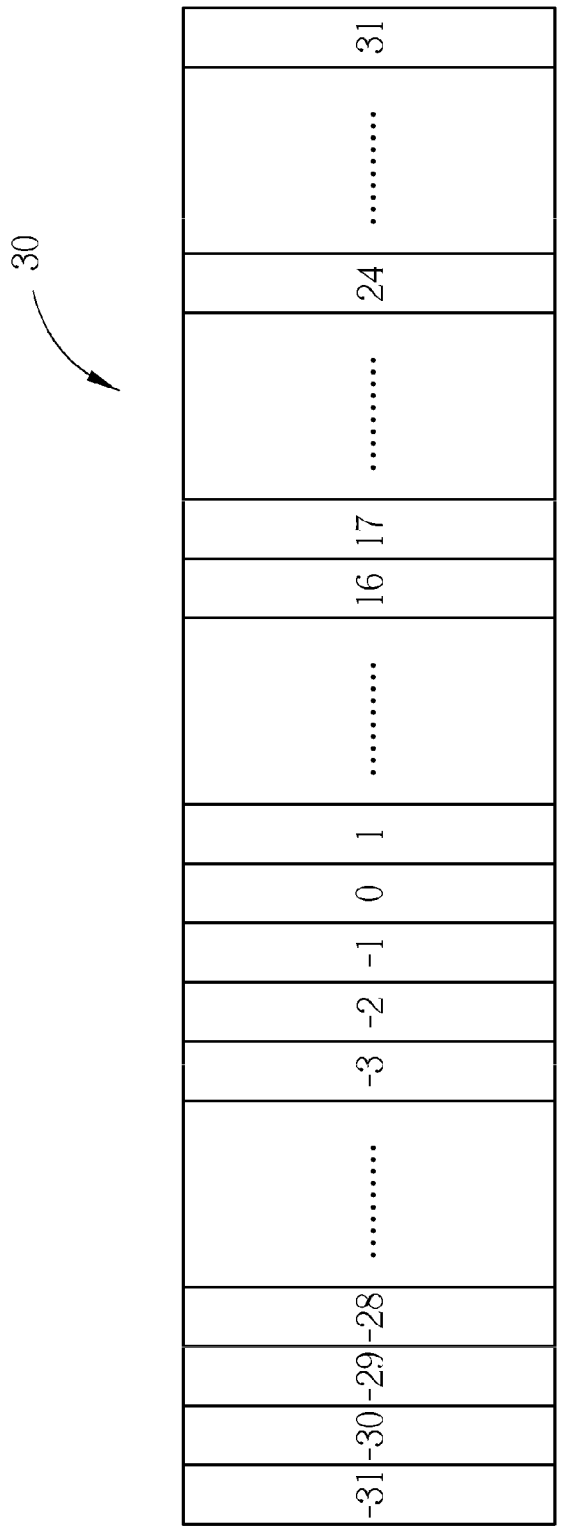
FIG. 3 shows a simplified diagram of the successive approximation register (SAR) algorithm for the calibration DAC having 6-bit resolution.

In an embodiment, the present invention can utilize a successive approximation register (SAR) algorithm in the correction module 164 for the calibration process. Please refer to FIG. 3. FIG. 3 shows a simplified diagram of the SAR algorithm for the calibration DAC having 6-bit resolution. As shown in FIG. 3, there are 63 sections in a block 30, and the 63 sections are labeled by number −31, −30, −29, −28, . . . , −3, −2, −1, 0, 1, 2, 3, . . . , 28, 29, 30, 31, respectively. The section of number −31 represents −93 mV, and the section of number −30 represents −90 mV, and the rest can be deduced by analogy. For example, when the detection unit 162 detects that a first differential output of the gm stage 140 is less than −4.5 mv (i.e. the DC offset exceeds 0.3% of the peak voltage) and generating a first DC offset detection signal accordingly, the correction module 164 utilizes the SAR algorithm to generate a first DC offset calibration value of 48 mv. More specifically, the SAR algorithm selects the section of number 16 which is a middle one between the section of number 1 and the section of number 31 to generate the first DC offset calibration value of 48 mv. Next, after the calibration DAC 166 converts the first DC offset calibration value of 48 mv into the DC offset calibration signal to perform the calibration process, when the detection unit 162 detects that a second differential output of the gm stage 140 is still less than −4.5 mv (i.e. the DC offset exceeds 0.3% of the peak voltage) and generating a second DC offset detection signal accordingly, the correction module 164 utilizes the SAR algorithm to generate a second DC offset calibration value of 72 mv. More specifically, the SAR algorithm selects the section of number 24 which is a middle one between the section of number 17 and the section of number 31 to generate the second DC offset calibration value of 72 mv. Next, after the calibration DAC 166 converts the second DC offset calibration value of 72 mv into the DC offset calibration signal to perform the calibration process, the detection unit 162 repeats to detect another differential output of the gm stage 140 and the correction module 164 repeats to utilize the SAR algorithm to generate another DC offset calibration value and the calibration DAC 166 repeats to convert the DC offset calibration value into the DC offset calibration signal to perform the calibration process until the DC offset is controlled to be under 4.5 mv (i.e. 0.3% of the peak voltage). Please note that the above embodiment is only for illustration purposes and is not meant to be limitations of the present invention. For example, the present invention also can utilize other algorithms or schemes in the correction module 164 to perform the calibration process.

The main spirit of the above embodiments of the present invention polar transmitter is using an auxiliary DAC having a lower resolution (such as 6-bit) than that of a main DAC (such as 11-bit) on the amplitude modulation path, so as to achieve the same performance of the conventional polar transmitter using only one DAC having higher resolution (such as 12-bit or 13-bit), which is costly to implement, both with respect to area on the circuit and power consumption. For example, when resolution of a DAC becomes higher for one bit, the area of the DAC is doubled, and thus the 12-bit DAC has twice larger area than the 11-bit DAC. Thus, when a larger cover range for the DC offset is required, the present invention polar transmitter does not have to use a DAC having higher resolution (such as 12-bit or 13-bit) for the DAC 120. Instead, the present invention polar transmitter can use a main DAC having the original resolution (such as 11-bit) with an auxiliary DAC having a lower resolution (such as 6-bit) to be economical to implement, both with respect to area on the circuit and power consumption.

Figure 4:
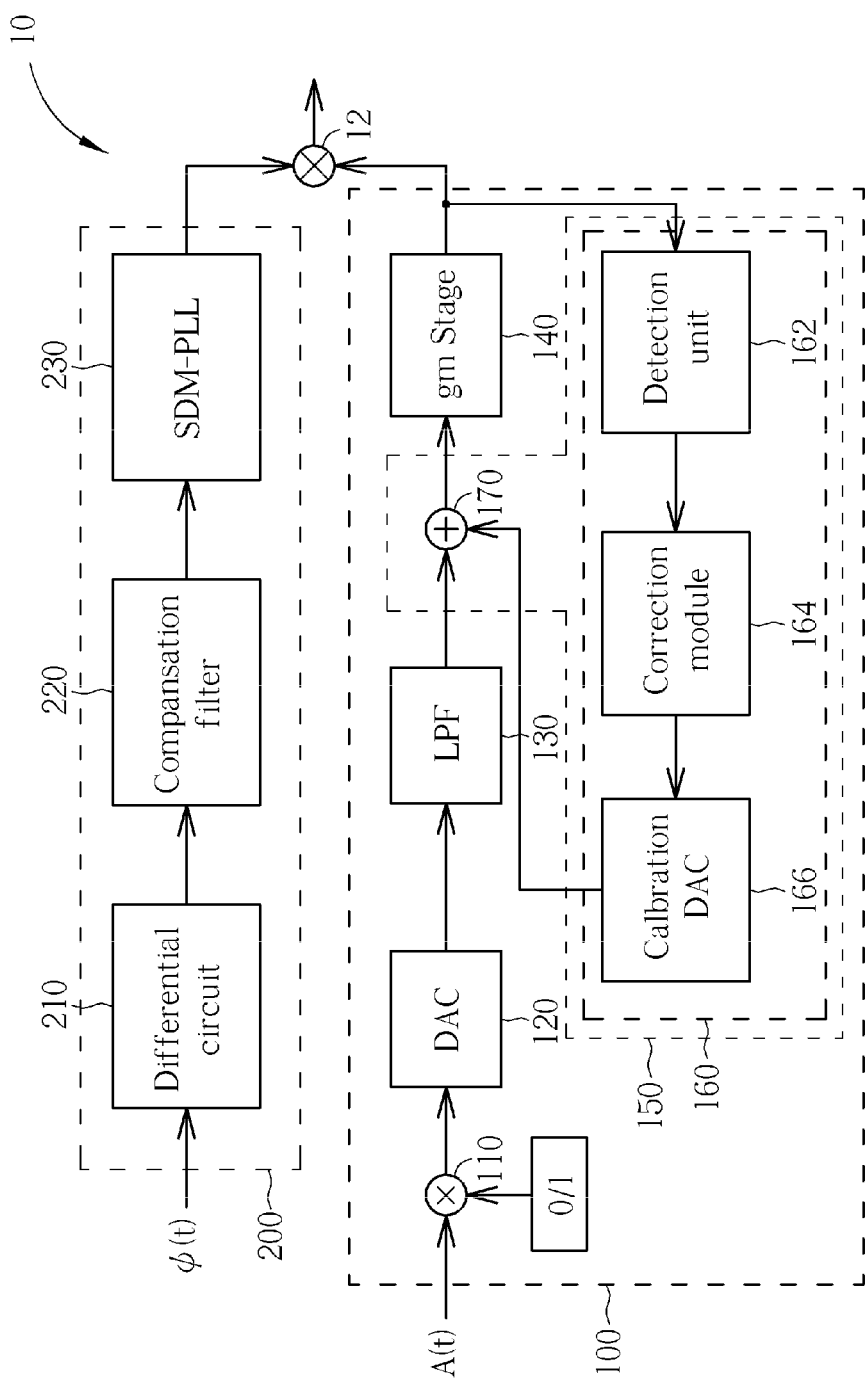
FIG. 4 shows a first variation of the amplitude modulation circuit in the polar transmitter shown in FIG. 1.
Figure 5:
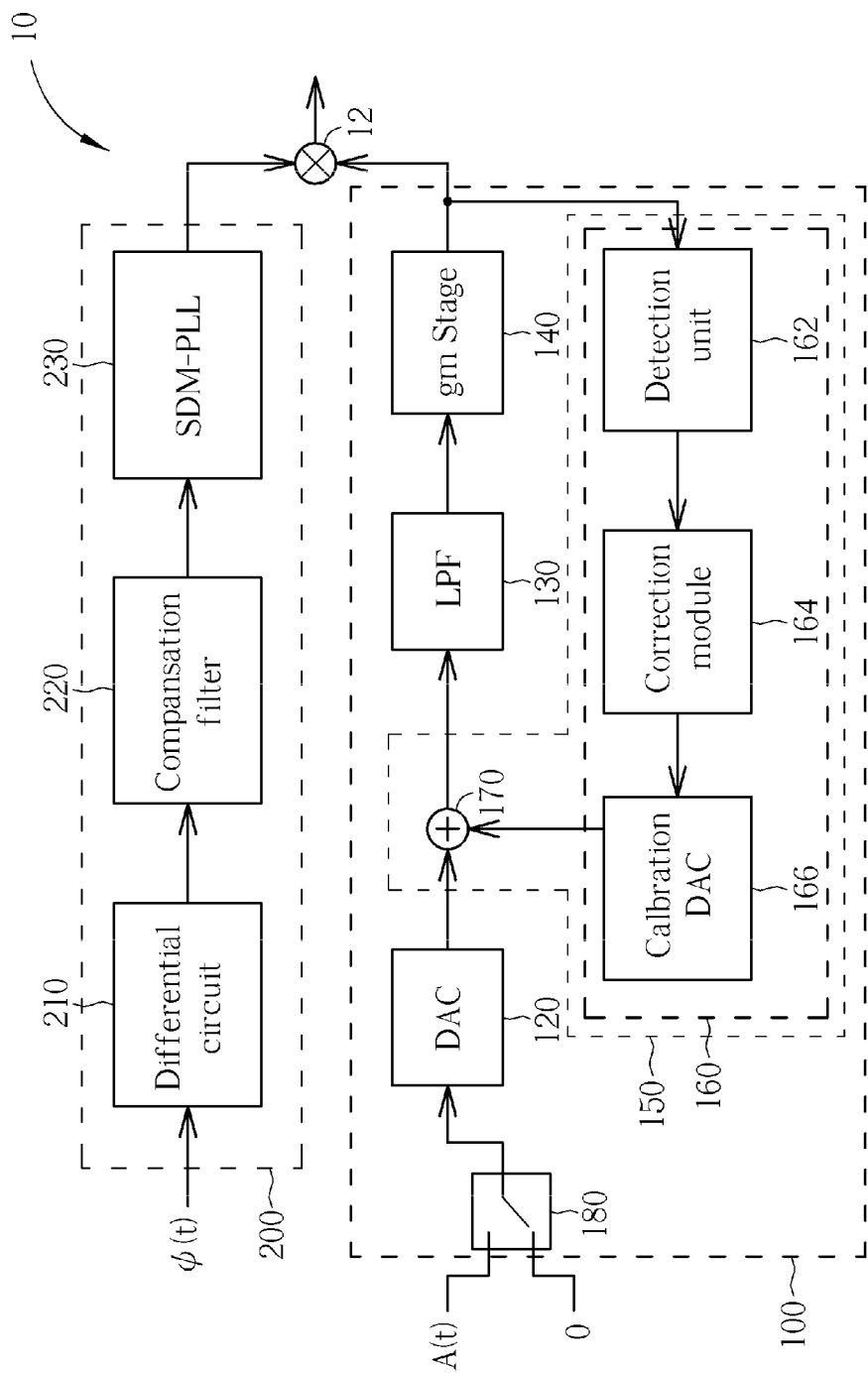
FIG. 5 shows a second variation of the amplitude modulation circuit in the polar transmitter shown in FIG. 1.

Please refer to FIG. 4. FIG. 4 shows a first variation of the amplitude modulation circuit 100 in the polar transmitter 10 shown in FIG. 1. As shown in FIG. 4, the adding unit 170 can be coupled between the gm stage 140 and the LPF 130. In addition, please refer to FIG. 5. FIG. 5 shows a second variation of the amplitude modulation circuit 100 in the polar transmitter 10 shown in FIG. 1. As shown in FIG. 5, the amplitude modulation circuit 100 can use a switch 180 to replace the multiplier 110. The switch 180 is coupled to the DAC 120, an amplitude modulation signal A(t), and a zero signal input, for selectively coupling the amplitude modulation signal A(t) or the zero signal input to the DAC 120.

Figure 6:
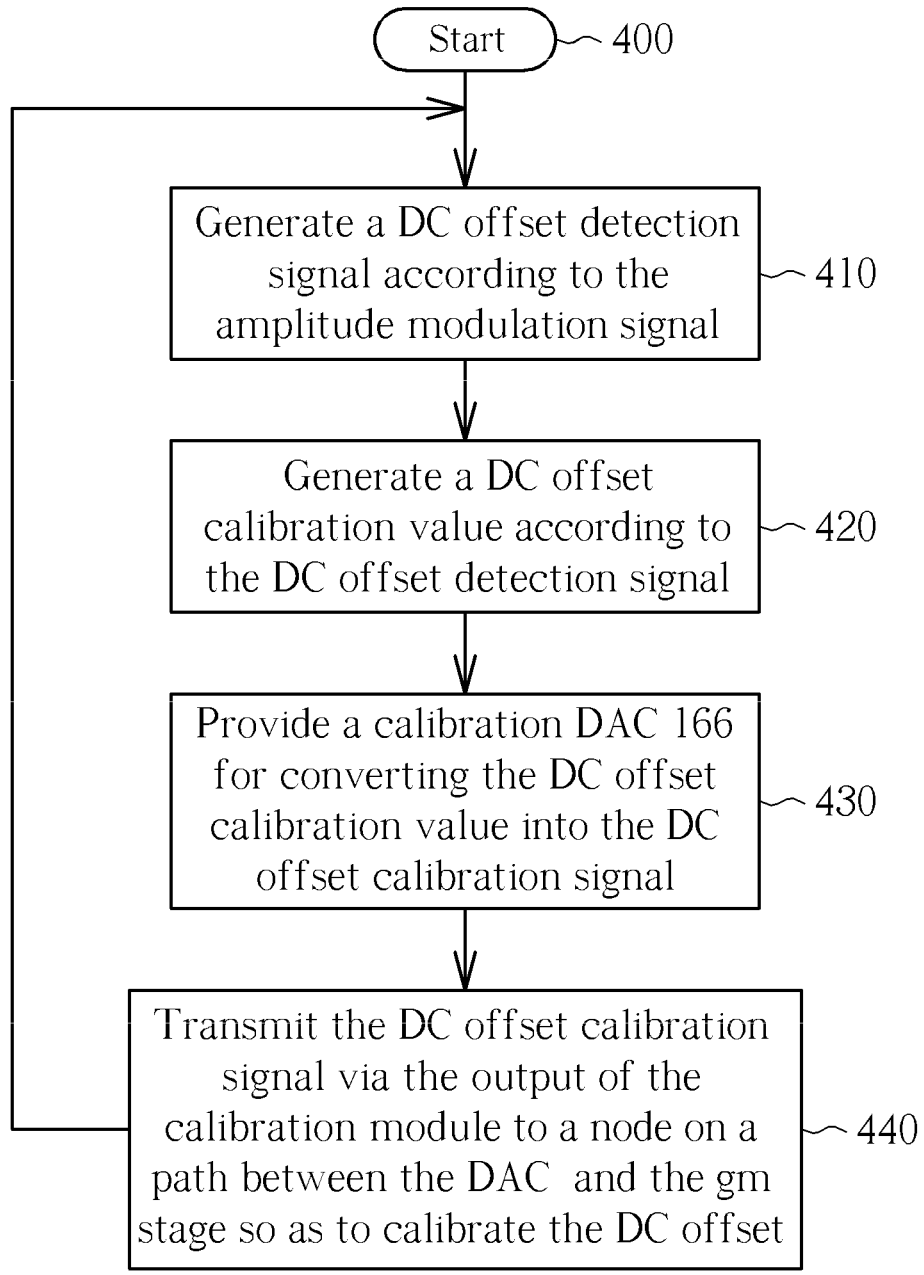
FIG. 6 is a flowchart showing a method for calibrating a DC offset in a polar transmitter in accordance with the operation scheme of the amplitude modulation circuit in the first embodiment of the present invention.

Please refer to FIG. 6. FIG. 6 is a flowchart showing a method for calibrating a DC offset in a polar transmitter in accordance with the operation scheme of the amplitude modulation circuit 100 in the first embodiment of the present invention. Provided that substantially the same result is achieved, the steps of the process flowchart need not be in the exact order shown and need not be contiguous, that is, other steps can be intermediate. The method for calibrating the DC offset in the polar transmitter according to the present invention comprises the following steps:

Step 400: Start.

Step 410: Generate a DC offset detection signal according to the amplitude modulation signal.

Step 420: Generate a DC offset calibration value according to the DC offset detection signal.

Step 430: Provide a calibration DAC 166 for converting the DC offset calibration value into the DC offset calibration signal.

Step 440: Transmit the DC offset calibration signal via the output of the calibration module 150 to a node on a path between the DAC 120 and the gm stage 140 so as to calibrate the DC offset.

Figure 7:
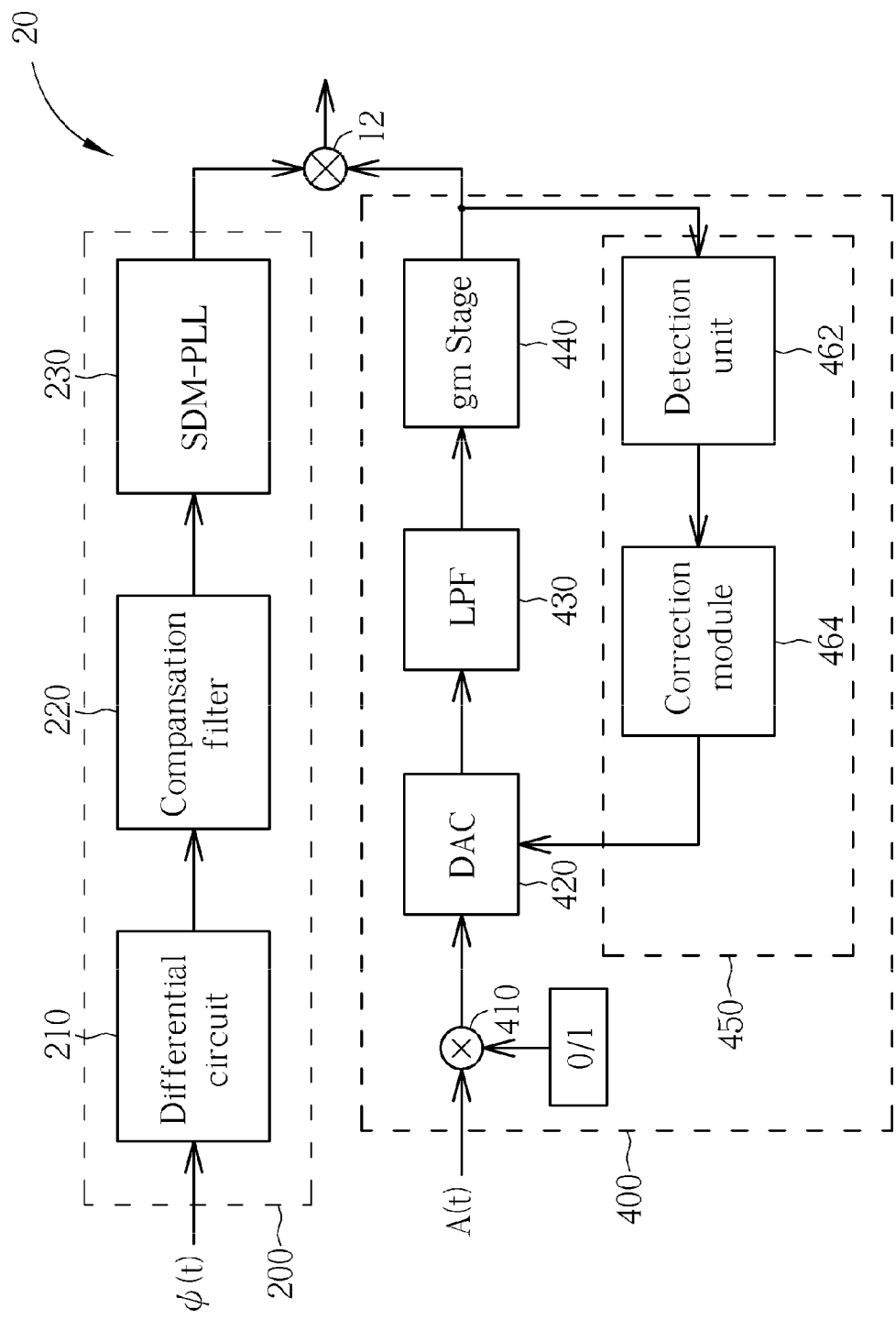
FIG. 7 shows a simplified block diagram of an amplitude modulation circuit in a polar transmitter in accordance with a second embodiment of the present invention.

Please refer to FIG. 7. FIG. 7 shows a simplified block diagram of an amplitude modulation circuit 400 in a polar transmitter 20 in accordance with a second embodiment of the present invention. As shown in FIG. 7, the polar transmitter 20 comprises the amplitude modulation circuit 400, the phase modulation circuit 200, and the mixer 12. The amplitude modulation circuit 400 comprises a multiplier 410, a DAC 420, a low pass filter (LPF) 430, a gm stage 440, and a calibration module 450. The DAC 420 is selectively coupled to an amplitude modulation signal A(t) via the multiplier 410. The calibration module 450 is utilized for adjusting a reference voltage level of the DAC 420 according to an amplitude modulation signal generated from the gm stage 440 to move a DC offset cover range of the DAC 420 so as to calibrate the DC offset of the amplitude modulation circuit 400. Thus, the present invention does not have to use a DAC having higher resolution (such as 12-bit or 13-bit) as the DAC 420 when a larger cover range for the DC offset is required.

In addition, the calibration module 450 can comprise a detection unit 462 and a correction module 464. The detection unit 462 is coupled to an output of the gm stage 440, and utilized for generating an offset detection signal according to the amplitude modulation signal. The correction module 464 is coupled to the detection unit 462, and utilized for generating an offset calibration signal according to the offset detection signal so as to adjust the reference voltage level of the DAC 420 to move the DC offset cover range of the DAC 420. Please note that the above embodiment is only for illustration purposes and is not meant to be limitations of the present invention.

Figure 8:
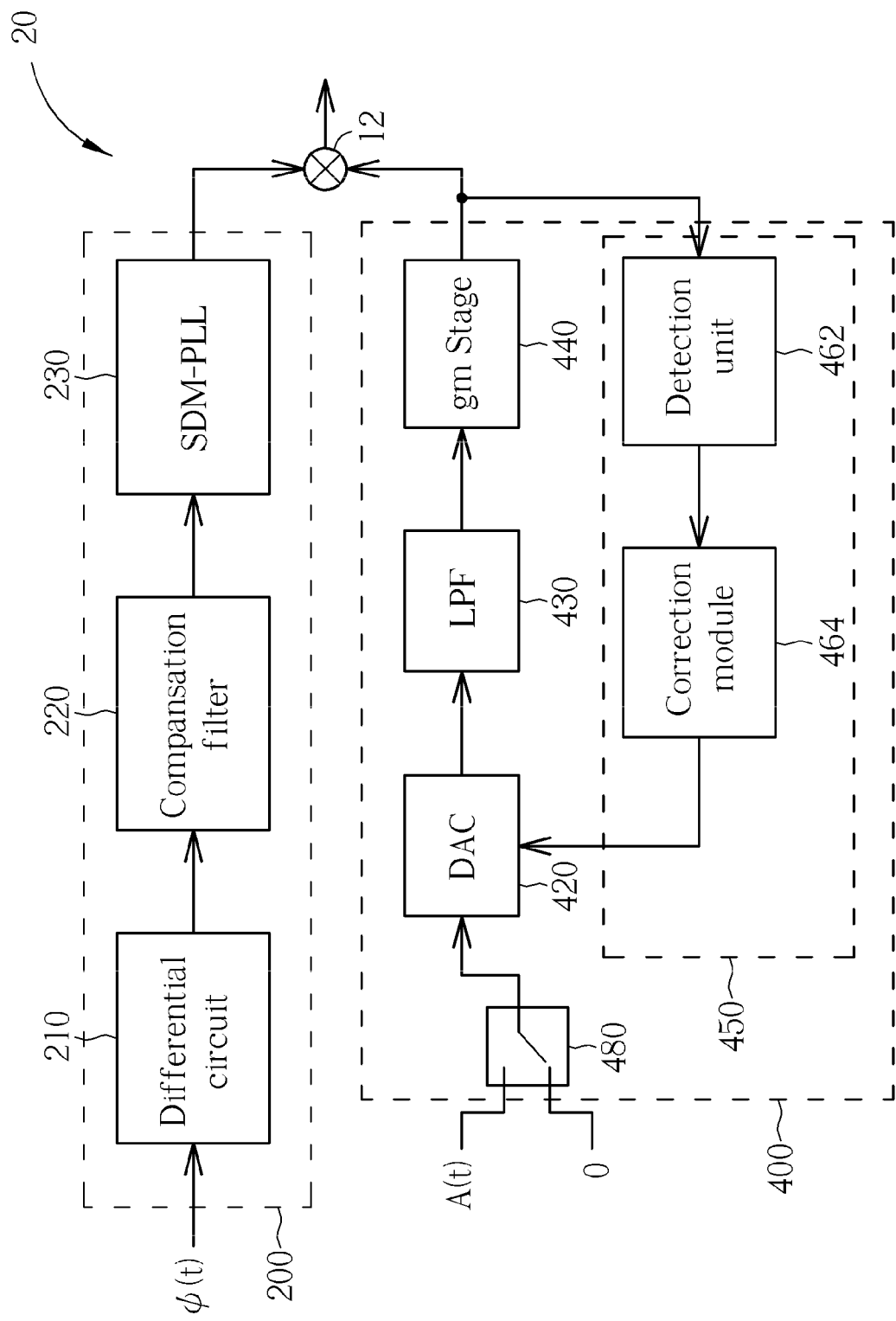
FIG. 8 shows a variation of the amplitude modulation circuit 400 in the polar transmitter shown in FIG. 7.

For example, please refer to FIG. 8. FIG. 8 shows a variation of the amplitude modulation circuit 400 in the polar transmitter 20 shown in FIG. 7. As shown in FIG. 8, the amplitude modulation circuit 400 can use a switch 480 to replace the multiplier 410. The switch 480 is coupled to the DAC 420, an amplitude modulation signal A(t), and a zero signal input, for selectively coupling the amplitude modulation signal A(t) or the zero signal input to the DAC 420.

Figure 9:
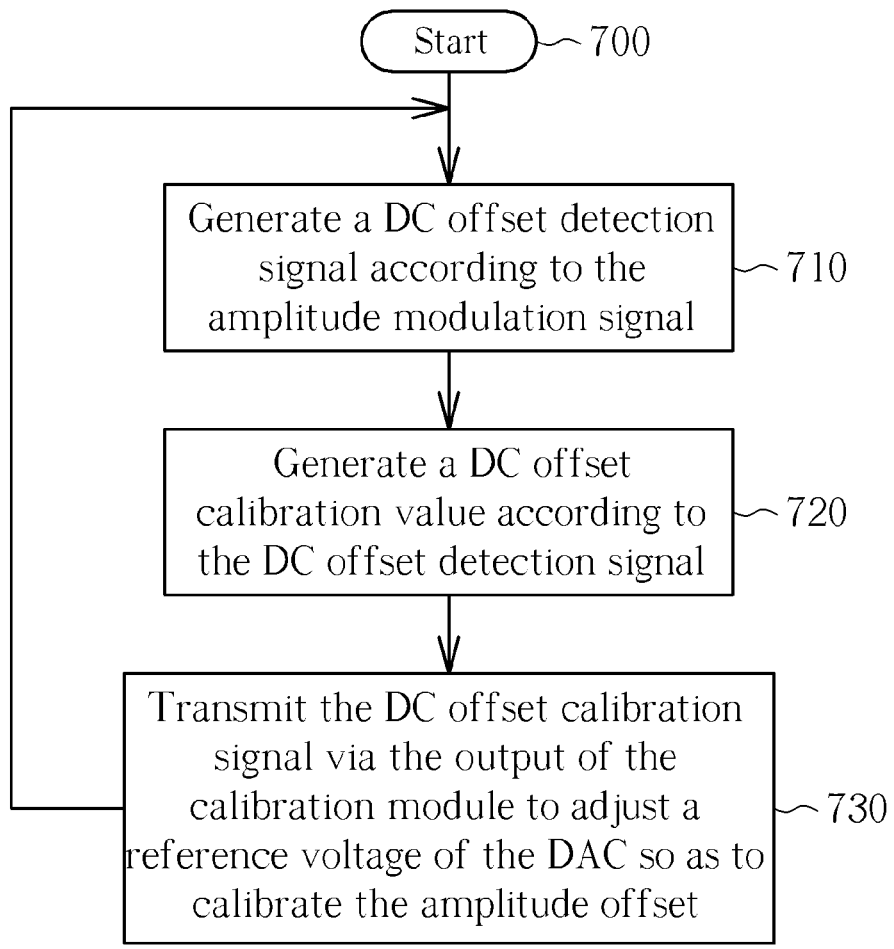
FIG. 9 is a flowchart showing a method for calibrating a DC offset in a polar transmitter in accordance with the operation scheme of the amplitude modulation circuit in the second embodiment of the present invention.

Please refer to FIG. 9. FIG. 9 is a flowchart showing a method for calibrating a DC offset in a polar transmitter in accordance with the operation scheme of the amplitude modulation circuit 400 in the second embodiment of the present invention. Provided that substantially the same result is achieved, the steps of the process flowchart need not be in the exact order shown and need not be contiguous, that is, other steps can be intermediate. The method for calibrating the DC offset in the polar transmitter according to the present invention comprises the following steps:

Step 700: Start.

Step 710: Generate a DC offset detection signal according to the amplitude modulation signal.

Step 720: Generate a DC offset calibration value according to the DC offset detection signal.

Step 730: Transmit the DC offset calibration signal via the output of the calibration module 450 to adjust a reference voltage level of the DAC 420 so as to calibrate the amplitude offset.

Briefly summarized, the amplitude modulation circuit and the method for calibrating the DC offset in a polar transmitter disclosed by the present invention are obviously capable of calibrating the DC offset in the polar transmitter with DAC having smaller area. Thus, the present invention is economical to implement, both with respect to area on the circuit and power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplitude modulation circuit in a polar transmitter, comprising:
   a digital-to-analog converter (DAC), arranged to receive an amplitude modulation signal input in a normal mode;
   a filter, coupled to the DAC;
   a gm stage, coupled to the filter; and
   a calibration module, having an input coupled to the gm stage, and an output coupled to a node on a path between the DAC and the gm stage.

2. The amplitude modulation circuit of claim 1, wherein the calibration module comprises:
   a calibration unit, for generating an offset calibration signal according to an amplitude modulation signal generated from the gm stage in a calibration mode; and
   an adding unit, coupled between the DAC and the filter, for receiving the offset calibration signal generated from the calibration unit and adding the offset calibration signal to the path.

3. The amplitude modulation circuit of claim 2, wherein the calibration unit comprises:
   a detection unit, coupled to an output of the gm stage, for generating an offset detection signal according to the amplitude modulation signal;
   a correction module, coupled to the detection unit, for generating an offset calibration value according to the offset detection signal; and
   a calibration DAC, coupled to the adding unit and the correction module, for converting the offset calibration value into the offset calibration signal.

4. The amplitude modulation circuit of claim 1, wherein the calibration module comprises:
   a calibration unit, for generating an offset calibration signal according to an amplitude modulation signal generated from the gm stage in a calibration mode; and
   an adding unit, coupled between the gm stage and the filter, for receiving the offset calibration signal generated from the calibration unit and adding the offset calibration signal to the path.

5. The amplitude modulation circuit of claim 4, wherein the calibration unit comprises:
   a detection unit, coupled to an output of the gm stage, for generating an offset detection signal according to the amplitude modulation signal;
   a correction module, coupled to the detection unit, for generating an offset calibration value according to the offset detection signal; and
   a calibration DAC, coupled to the adding unit and the correction module, for converting the offset calibration value into the offset calibration signal.

6. The amplitude modulation circuit of claim 1, further comprising:
   a switch, coupled to the DAC, the amplitude modulation signal input, and a zero signal input, for coupling the amplitude modulation signal input to the DAC in the normal mode and coupling the zero signal input to the DAC in a calibration mode.

7. The amplitude modulation circuit of claim 1, further comprising:
   a multiplier, coupled between the DAC and the amplitude modulation signal input, for coupling the amplitude modulation signal input to the DAC, and for setting an input of the DAC to zero in a calibration mode.

8. The amplitude modulation circuit of claim 1, wherein the input of the calibration module is coupled to a differential output of the gm stage, and the calibration module is arranged to generate a DC offset calibration signal according to a differential amplitude modulation signal generated from the gm stage.

9. A method for calibrating an amplitude offset in a polar transmitter, comprising:
   providing an amplitude modulation circuit in the polar transmitter, the amplitude modulation circuit comprising a digital-to-analog converter (DAC) arranged to receive an amplitude modulation signal input in a normal mode, a filter coupled to the DAC, a gm stage coupled to the filter, and a calibration module having an output and an input coupled to the gm stage;
   generating an amplitude offset calibration signal according to an amplitude modulation signal generated from the gm stage; and
   transmitting the amplitude offset calibration signal via the output of the calibration module to a node on a path between the DAC and the gm stage so as to calibrate the amplitude offset.

10. The method of claim 9, wherein the step of transmitting the amplitude offset calibration signal via the output of the calibration module to the node on the path between the DAC and the gm stage comprises:
    transmitting the amplitude offset calibration signal via the output of the calibration module to a node on the path between the DAC and the filter.

11. The method of claim 9, wherein the step of transmitting the amplitude offset calibration signal via the output of the calibration module to the node on the path between the DAC and the gm stage comprises:
    transmitting the amplitude offset calibration signal via the output of the calibration module to a node on the path between the filter and the gm stage.

12. The method of claim 9, wherein the step of generating the amplitude offset calibration signal according to the amplitude modulation signal generated from the gm stage comprises:
    generating an amplitude offset detection signal according to the amplitude modulation signal;
    generating an amplitude offset calibration value according to the amplitude offset detection signal; and
    providing a calibration DAC for converting the amplitude offset calibration value into the amplitude offset calibration signal.

13. The method of claim 9, wherein the input of the calibration module is coupled to a differential output of the gm stage, and the calibration module is arranged to generate a DC offset calibration signal according to a differential amplitude modulation signal generated from the gm stage.

14. An amplitude modulation circuit in a polar transmitter, comprising:
    a digital-to-analog converter (DAC), arranged to be coupled to an amplitude modulation signal input in a normal mode;
    a filter, coupled to the DAC;
    a gm stage, coupled to the filter; and a calibration module, having an input coupled to the gm stage, and an output coupled to the DAC, for adjusting a reference voltage level of the DAC according to an amplitude modulation signal generated from the gm stage to move an offset cover range of the DAC so as to calibrate an offset of the amplitude modulation circuit.

15. The amplitude modulation circuit of claim 14, wherein the calibration module comprises:
    a detection unit, coupled to an output of the gm stage, for generating an offset detection signal according to the amplitude modulation signal in a calibration mode; and
    a correction module, coupled to the detection unit, for generating an offset calibration signal according to the offset detection signal so as to adjust the reference voltage level of the DAC.

16. The amplitude modulation circuit of claim 14, further comprising:
    a switch, coupled to the DAC, an amplitude modulation signal input, and a zero signal input, for coupling the amplitude modulation signal input to the DAC in the normal mode and coupling the zero signal input to the DAC in a calibration mode.

17. The amplitude modulation circuit of claim 14, further comprising:
    a multiplier, coupled between the DAC and the amplitude modulation signal input, for coupling the amplitude modulation signal input to the DAC, and for setting an input of the DAC to zero in a calibration mode.

18. The amplitude modulation circuit of claim 14, wherein the input of the calibration module is coupled to a differential output of the gm stage, and the calibration module is arranged to generate a DC offset calibration signal according to a differential amplitude modulation signal generated from the gm stage.

19. A method for calibrating an amplitude offset in a polar transmitter, comprising:
    providing an amplitude modulation circuit in the polar transmitter, the amplitude modulation circuit comprising a digital-to-analog converter (DAC), a filter coupled to the DAC, a gm stage coupled to the filter, and a calibration module having an input coupled to the gm stage, and an output coupled to the DAC;
    generating an amplitude offset calibration signal according to an amplitude modulation signal generated from the gm stage; and
    feedbacking the amplitude offset calibration signal via the output of the calibration module to the DAC to adjust a reference voltage level of the DAC to move an offset cover range of the DAC so as to calibrate the amplitude offset.

20. The method of claim 19, wherein the step of generating the amplitude offset calibration signal according to the amplitude modulation signal generated from the gm stage comprises:
    generating an amplitude offset detection signal according to the amplitude modulation signal; and
    generating an amplitude offset calibration signal according to the offset detection signal so as to adjust the reference voltage level of the DAC.

21. The method of claim 19, wherein the input of the calibration module is coupled to a differential output of the gm stage, and the amplitude modulation signal generated from the gm stage is in a differential form.

* * * * *